United States Patent [19]

Herzog et al.

[11] Patent Number: 4,843,028
[45] Date of Patent: Jun. 27, 1989

[54] METHOD FOR PRODUCING A SPATIALLY PERIODIC SEMICONDUCTOR LAYER STRUCTURE

[75] Inventors: Hans-Joest Herzog, Neu-Ulm; Helmut Jorke, Gerstetten; Horst Kibbel, Erbach, all of Fed. Rep. of Germany

[73] Assignee: LIcentia Patent-Verwaltungs-GmbH, Frankfurt am Main, Fed. Rep. of Germany

[21] Appl. No.: 282,940

[22] Filed: Dec. 8, 1988

Related U.S. Application Data

[63] Continuation of Ser. No. 864,469, May 19, 1986, abandoned.

[30] Foreign Application Priority Data

May 17, 1985 [DE] Fed. Rep. of Germany ....... 3517701
Jul. 31, 1985 [DE] Fed. Rep. of Germany ....... 3527363

[51] Int. Cl.$^4$ .......................................... H01L 29/205
[52] U.S. Cl. ............................. 437/81; 148/DIG. 58; 148/DIG. 40; 148/DIG. 72; 148/DIG. 132; 148/DIG. 160; 357/16; 437/106; 437/110; 437/126; 437/131; 437/959; 437/976
[58] Field of Search ....................... 136/256, 258; 148/DIG. 2, 40, 58, 72, 97, 129, 132, 160, 169; 357/30, 2, 16; 423/345; 437/81, 105–107, 110, 126, 131, 930, 758, 971, 959, 976

[56] References Cited

U.S. PATENT DOCUMENTS 4,450,316 5/1984 Hamakawa et al. ................. 136/256

FOREIGN PATENT DOCUMENTS 0005059 10/1979 European Pat. Off. .
0133342 2/1985 European Pat. Off. .

OTHER PUBLICATIONS

People et al., "Modulation Doping in $Ge_xSi_{1-x}$/Si Strained Layer Heterstructures," Appl. Phys. Lett., 45(11), 1 Dec. 1984, pp. 1231–1233.
Single et al., "Building Semiconductors from the Atom up," Bell Lab. Record, vol. 58, No. 8, Sep. 1980, pp. 274–281.
Manaserit et al., "The Properties of $Si/Si_{1-x}Ge_x$ Films ... Chemical Vapor Deposition," J. Elect. Mat., vol. 12, No. 4, 1983, pp. 637–650.
Abstreiter et al., "Strain-Induced Two-Dimensional ... ," Physical Review Letters, vol. 54, No. 22, Jun. 3, 1985, pp. 2441–2444.
Manaserit et al., "Electron Mobility Enhancement ... ", Appl. Phys. Lett. 41(5), 1 Sep. 1982, pp. 464–466.
Kasper et al., "A One-Dimensional SiGe Superlattice . . . ", Appl Phys., vol. 8, 1975, pp. 199–205.
Itoh et al., "Epitaxial Growth of Silicon ... ", Radiation effects, 1971, vol. 9, pp. 1–4.
König et al., "Si-MBE: Growth and Sb Doping", J. Vac. Sci. Technol., 16(4), Jul./Aug. 1979, pp. 985–989.

Primary Examiner—Brian E. Hearn
Assistant Examiner—William Bunch
Attorney, Agent, or Firm—Spencer & Frank

[57] ABSTRACT

In a method for producing a spatially periodic semiconductor layer structure in the form of a superlattice composed of an alternating arrangement of strained semiconductor layers of at least two different semiconductor compositions forming at least one heterojunction, at least one of the semiconductor layers is provided with a doped layer which extends essentially parallel to the heterojunction and whose layer thickness is no greater than the thickness of the semiconductor layer in which it is produced.

17 Claims, 2 Drawing Sheets

METHOD FOR PRODUCING A SPATIALLY PERIODIC SEMICONDUCTOR LAYER STRUCTURE

This application is a continuation of application Ser. No. 06/864,469, filed May 19, 1986 now abandoned.

BACKGROUND OF THE INVENTION

The present invention relates to a method for producing a spatially periodic semiconductor layer structure in the form of a superlattice.

Particularly in the electrical industry, semiconductor elements are required which switch electrical currents in the shortest possible time. This can be accomplished, on the one hand, by reducing the respective structural dimensions and, on the other hand, by using semiconductor materials which have high electron mobility.

The publication by H. M. Manasevit et al in the Journal of Electronic Materials, No. 12, page 637 (1983) discloses, for example, an Si-SiGe semiconductor layer structure which is constructed as a so-called superlattice and which has a slightly higher electron mobility than homogeneously doped Si semiconductor material.

SUMMARY OF THE INVENTION

It is an object of the present invention to provide a method of this type which achieves the highest possible electron mobility, particularly in semiconductor layers containing silicon and operating at room temperature (300° K.).

The above and other objects are achieved, according to the invention, in a method for producing a spatially periodic semiconductor layer structure in the form of a superlattice composed of an alternating arrangement of semiconductor layers of at least two different semiconductor compositions forming at least one heterojunction, by the improvement which includes producing in at least one of the semiconductor layers a doped layer which extends essentially parallel to the heterojunction and whose layer thickness is no greater than the thickness of the semiconductor layer in which it is produced.

The invention will be described in greater detail below, with reference to the drawings.

DESCRIPTION OF THE PREFERRED EMBODIMENTS

Figure 1:
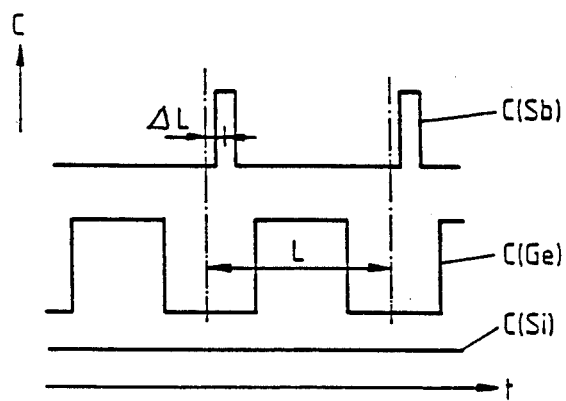
FIG. 1 is a diagram illustrating the doping curve of an exemplary Si-SiGe semiconductor layer structure.

FIG. 1 illustrates the relative concentrations, C, of components of an epitaxial layer being formed, as a function of time, when the concentration of one or more components forming the layer varies with time, t.

According to FIG. 1, an exemplary Si-SiGe semiconductor layer structure is produced by a molecular beam epitaxy process (MBE process). During the growth of the semiconductor layer structure, the Si concentration C(Si) is kept essentially constant. A germanium (Ge) source is periodically opened and closed as a function to time t so that the Ge concentration C(Ge) has the illustrated pulse shaped variation with a period duration L.

On an exemplary semiconductor substrate made of a $Si_{0.75}Ge_{0.25}$ mixed crystal having a (100) crystal orientation, there thus results a semiconductor layer structure of alternating Si and SiGe semiconductor layers, with each layer having a selected thickness of, for example, 5 nm. The concentrations C(Si) and C(Ge) are here selected in such a manner that essentially pure Si semiconductor layers and $Si_{0.55}Ge_{0.45}$ mixed crystal semiconductor layers result.

If now, during this layer growth, antimony (Sb) is additionally doped in periodically in time, the associated Sb concentration (C(Sb) has, for example, the pulse-shaped configuration also shown in FIG. 1. Thus, an Sb doped additional layer is produced in the semiconductor layer structure with a layer thickness which is less than or equal to the thickness of the basic Si and SiGe layers.

The center of each Sb pulse is displaced by an interval $\Delta L$ from a selected reference point associated with each Ge pulse.

A change in the so-called doping phase angle $\phi = 2\pi \cdot \Delta L/L$ makes it possible, for example, to dope with Sb either only the Si semiconductor layers or only the $Si_{0.55}Ge_{0.45}$ semiconductor layers. Surprisingly, it has been noted that Sb doping in only the $Si_{0.55}Ge_{0.45}$ semiconductor layers results in a significant increase in electron mobility in the created superlattice.

Figure 2:
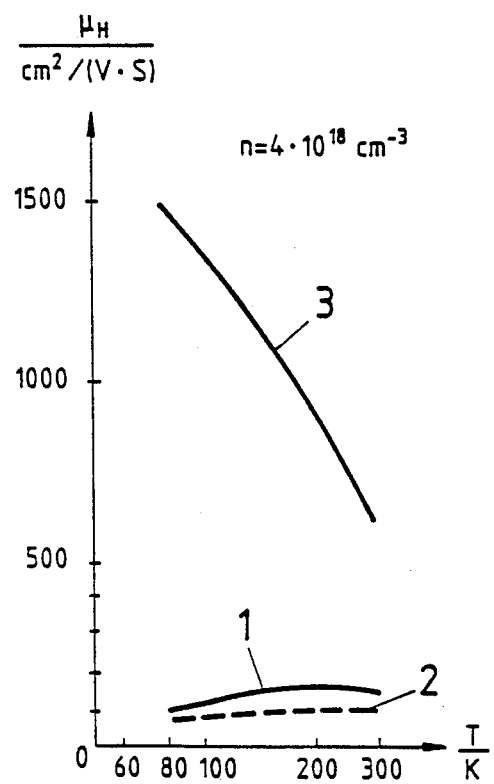
FIG. 2 is a graph showing Hall mobility $\mu_H$ as a function of the operating temperature T for various semiconductor materials.
Figure 3:
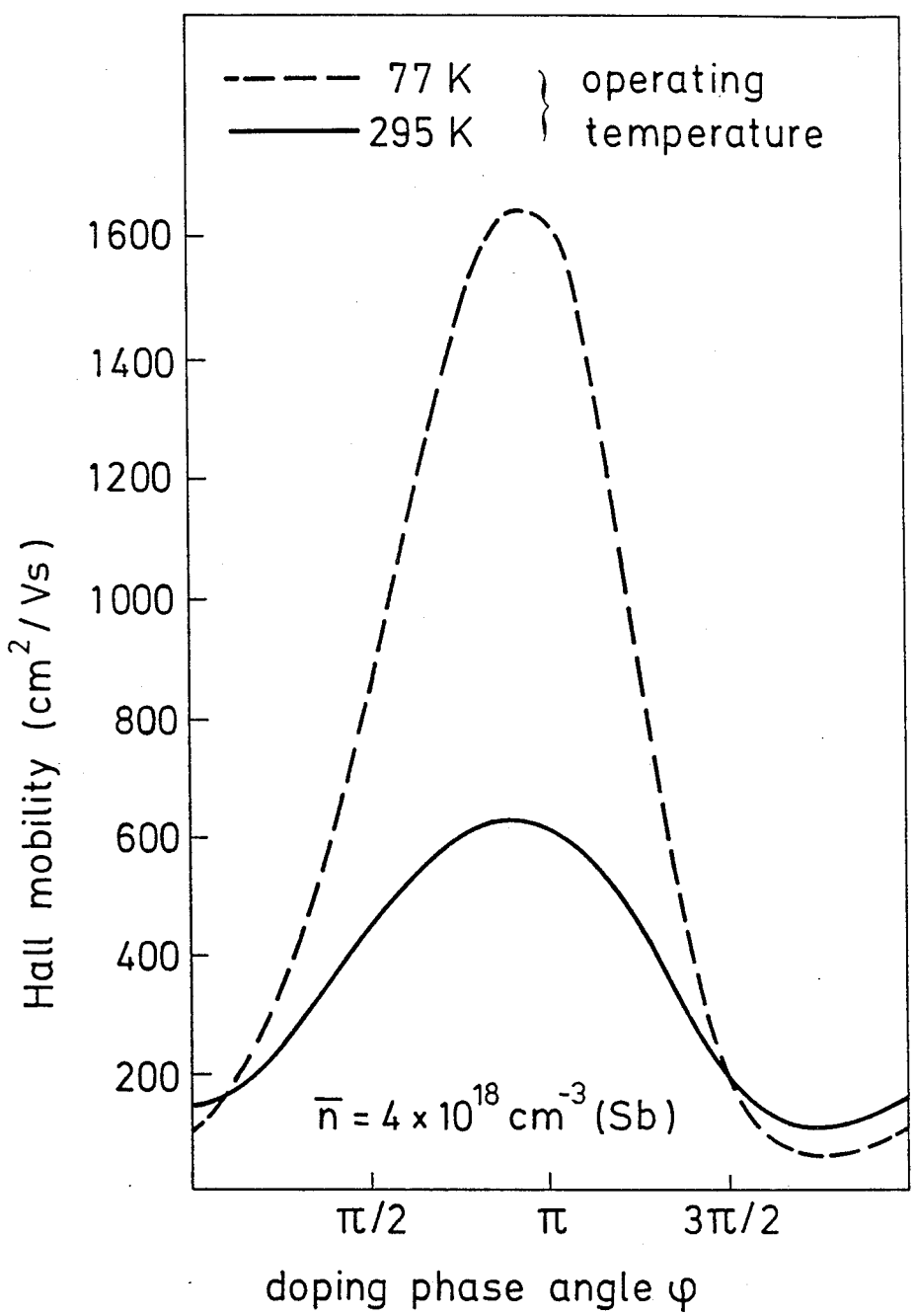
FIG. 3 is a graph showing Hall mobility versus doping phase angle $\phi$ for two operating temperatures.

FIG. 2 shows the dependency of the Hall mobility, $\mu_H$, of the electrons on operating temperature, T, for various semiconductor materials. Curve 1 relates to monocrystalline Si material with a homogeneous Sb doping of $4 \times 10^{18}$ cm$^{-3}$. Curve 2 relates to $Si_{0.75}Ge_{0.25}$ semiconductor material with a homogeneous Sb doping of $4 \times 10^{18}$ cm$^{-3}$. Curve 3 relates to a superlattice of alternating Si and $Si_{0.55}Ge_{0.45}$ layers, each layer having a spatial period duration, corresponding to the period L, of about 10 nm and composed of 10 periods, or layer pairs. In this superlattice, only the $Si_{0.55}Ge_{0.45}$ semiconductor layers are doped with Sb with an area concentration $n_s = 4.10^{12}$ cm$^{-2}$ FIG. 2 shows that the electron mobility according to curve 3 at room temperature (300° K.) is approximately four times as high as the electron mobility according to curves 1 and 2 obtained from samples with a doping level of $n = 4 \times 10^{18}$ cm$^{-3}$. Moreover, it is advantageously possible to set the electron mobility by changing the above-mentioned doping phase angle and/or the operating temperature T. FIG. 3 shows the dependence of Hall mobility on the doping phase angle $\phi$ for two operating temperatures. The average Sb dopant concentration in the superlattice layers amounts to $n = 4 \times 10^{18}$ cm$^{-3}$.

\* The corresponding average dopant concentration n in the superlattice amounts to $4 \times 10^{18}$ cm$^{-3}$ obtained from the area concentration $n_s$ by the relation:

$$\frac{n_s \, [\text{cm}^{-2}]}{L \, [\text{cm}]} = n \, [\text{cm}^{-3}]$$

In FIG. 2 curve 1, 2, and 3 refer to samples with a doping concentration and a average doping concentration of $4 \times 10^{18}$ cm$^3$, respectively, and, additionally, curve 2 and 3 refer to samples with a Ge content and an average Ge content of about 25%, respectively.

It must be mentioned that the mobility improvement in the superlattice is determined by the spatial separation of the carriers from their parent impurities and is independent on the numbers of layer pairs.

It has now been surprisingly found that, in addition to the above-mentioned doping, the mechanical strain or stress state of the semiconductor layers of the superlattice also has a considerable influence on the electron mobility $\mu_H$. In this connection, the lateral mechanical strain within the semiconductor layers is of particular importance. Lateral mechanical stress is understood to be that mechanical stress (force/area) which is produced in the semiconductor layer if a tension or compression force acts of the semiconductor layer, with the direction of such force lying in the plane of the semiconductor layer. The semiconductor layer is tensioned or compressed as a function of the direction of that force. This lateral stress is not equal to the socalled transverse stress which produces so-called shearing forces in a body.

This lateral mechanical stress can be set in a superlattice by the selection of the lattice constants in the individual monocrystalline semiconductor layers. If, for example, a substrate is used which is essentially composed of one type of atom, e.g. an Si substrate having a (100) crystal orientation, this Si substrate has a natural (100) lattice constant of 0.543 nm. If now, for example, an $Si_{0.5}Ge_{0.5}$ semiconductor layer is grown on this Si substrate by a molecular beam epitaxy (MBE) process, the stratum of the $Si_{0.5}Ge_{0.5}$ semiconductor layer immediately adjacent the Si substrate has the same lattice constant in the lateral direction as the monocrystalline silicon layer therebelow. This is called the pseudomorphic growth of a heteroepitaxial layer. Only above a so-called critical layer thickness does the lattice constant change in the lateral direction of the $Si_{0.5}Ge_{0.5}$ layer by mismatching offsets from its natural lattice constant of 0.554 nm.

A layer having a thickness less than the critical thickness is also called a subcritical layer. A layer having a thickness greater than the critical thickness is also called a supercritical layer. The critical layer thickness here depends on the composition of the semiconductor layer.

If now, for example, an $Si_{0.5}Ge_{0.5}$ semiconductor layer is deposited on an Si substrate to a subcritical layer thickness, a lateral mechanical compression stress is produced in the $Si_{0.5}Ge_{0.5}$ semiconductor layer, since the natural lattice constant of monocrystalline $Si_{0.5}Ge_{0.5}$ is greater than that of monocrystalline Si. In this way, it is possible to produce different lateral tension or compression stresses in the semiconductor layer structure of a superlattice so as to influence electron mobility.

For example, it is possible to initially deposit, on an si substrate having a (100) crystal orientation and a natural lattice constant of 0.543 nm, a first intermediate layer of a monocrystalline $Si_{0.75}Ge0.25$ semiconductor material. This first intermediate layer has a supercritical layer thickness of about 0.2 $\mu$. On this first intermediate layer, ten semiconductor layer sets of an Si-SiGe superlattice are now deposited. These layer sets are composed of an alternating sequence of a monocrystalline Si semiconductor layer having a subcritical layer thickness of, for example, 5 nm, and a monocrystalline $Si_{0.5}Ge_{0.5}$ semiconductor layer having a subcritical layer thickness of likewise, for example, 5 nm. In this way, lateral tension stress is produced in each Si semiconductor layer, while lateral compression stress is produced in each $Si_{0.5}Ge_{0.5}$ layer.

Moreover, it is possible to select the composition of the substrate and/or of the intermediate layer in such a way that they have lattice constants which produce the desired lateral mechanical stresses in the subcritical semiconductor layer structure of the superlattice deposited thereon.

It is further possible to change the mechanical stress state within the semiconductor layer structure of the superlattice. This can be accomplished by providing a second semiconductor intermediate layer. If, for example, a superlattice composed of an alternating sequence of two subcritical Si semiconductor layers and two subcritical $Si_{0.5}Ge_{0.5}$ semiconductor layers is deposited on the above-mentioned first intermediate layer, the above-mentioned lateral mechanical compression and tension forces are produced in these semiconductor layers. If now, a second monocrystalline intermediate layer is deposited on this $Si_{0.5}Ge_{0.5}$ superlattice, e.g. a supercritical monocrystalline Si semiconductor layer, a superlattice composed, for example, of an alternating sequence of two subcritical monocrystalline $Si_{0.75}Ge_{0.25}$ semiconductor layers and two subcritical monocrystalline Si semiconductor layers can be deposited on this second intermediate layer.

The result is two superlattices whose mechanical strain or stress states are decoupled by the second intermediate layer or can be coupled together in a predeterminable manner.

Listing of after doping materials that can be used in the embodiment of the invention: P, Ac, Bi.

Additional doping, e.g. with antimony, of the semiconductor layers of the superlattice is possible with the method of secondary doping substance implantation as disclosed in U.S. Application Ser. No. 06/800,414 filed by Jorke et al on Nov. 21, 1985.

The present invention is not limited to the described embodiment but can be used similarly for other material combinations in which lattice mismatch induced lateral strain leads to an appropriate conduction band reordering.

This application relates to subject matter disclosed in Federal Republic of Germany Application Nos. P 35 17 701.2 of May 17, 1985 and P 35 27 363.1 of July 31, 1985, the rights of priority for which are claimed for the present application and the disclosures of which are incorporated herein by reference.

It will be understood that the above description of the present invention is susceptible to various modifications, changes and adaptations, and the same are intended to be comprehended within the meaning and range of equivalents of the appended claims.

Such combinations are for example:

SiGe/GaP,
SiGe/FrGaAs,
GaMnAs/FnP,
GaAs/FnGaAs.

What is claimed is:

1. In a method for producing, by a molecular beam epitaxy process, a spatially periodic semiconductor layer structure in the form of a superlattice composed of an alternating arrangement of semiconductor layers of at least two different semiconductor compositions forming at least one heterojunction, one of the different semiconductor composition being SiGe, the improvement comprising: producing, by the molecular beam epitaxy process, in at least one of the SiGe semiconductor layers a doped layer which extends essentially parallel to the heterojunction and whose layer thickness is no greater than the thickness of the SiGe semiconductor layer in which it is produced, and producing at least one of the semiconductor layers forming a heterojunction with a subcritical layer thickness.

2. A method as defined in claim 1 wherein one of the semiconductor compositions is constituted by a single element and the other one of the compositions includes a mixture of two elements.

3. A method as defined in claim 1 wherein the two different semiconductor compositions are Si and SiGe, respectively.

4. A method as defined in claim 3 wherein the at least one doped layer is produced in the at least one SiGe semiconductor layer by introducing an element of Group V of the Periodic Table of Elements as a dopant.

5. A method as defined in claim 4, wherein there is a plurality of doped layers arranged periodically in space in the semiconductor layer structure with a periodicity which corresponds to that of the semiconductor layer structure.

6. A method as defined in claim 1, wherein there is a plurality of doped layers arranged periodically in space in the semiconductor layer structure with a periodicity which corresponds to that of the semiconductor layer structure.

7. A method as defined in claim 1 wherein said step of producing a doped layer is carried out using antimony as a dopant.

8. A method as defined in claim 1 wherein at least one semiconductor layer of the superlattice has a subcritical layer thickness.

9. A method as defined in claim 1 wherein the semiconductor layer structure of the superlattice is applied to a monocrystalline substrate; at least one semiconductor layer of the superlattice has a composition which corresponds to that of the substrate; and at least one other semiconductor layer of the superlattice has a subcritical layer thickness.

10. A method as defined in claim 1 wherein: the semiconductor layer structure of the superlattice is applied to a substrate composed of a mixed crystal; the layers of the superlattice have compositions different from that of the substrate; and the semiconductor layers of the superlattice each have a subcritical layer thickness.

11. A method as defined in claim 1 wherein the semiconductor layer structure of the superlattice is applied to a monocrystalline substrate which is essentially composed of Si atoms and one of the semiconductor layers of the superlattice is a SiGe semiconductor layer having a subcritical layer thickness.

12.. A method as defined in claim 1 comprising the initial step of producing a first intermediate semiconductor layer on a monocrystalline substrate, and wherein the semiconductor layer structure in the form of a superlattice is deposited on the first intermediate layer and the first intermediate layer has a supercritical layer thickness.

13. A method as defined in claim 12 wherein the first intermediate layer is a monocrystalline layer having a lattice constant which is between the lattice constant of each semiconductor layer of one composition and the lattice constant of each semiconductor layer of the other composition.

14. A method as defined in claim 12 wherein the first intermediate layer is composed of an SiGe mixed crystal and the two different semiconductor compositions of the semiconductor layers of the semiconductor layer structure are Si and SiGe, respectively, and each layer of the semiconductor layer structure has a subcritical layer thickness.

15. A method as defined in claim 12 wherein: the semiconductor layers of the semiconductor layer structure are disposed in two groups each having an alternating arrangement of at least two of the semiconductor layers; a second intermediate semiconductor layer is interposed between the two groups; the two different semiconductor compositions are Si and SiGe, respectively; the second intermediate layer has a lattice constant which is between the lattice constant of each Si semiconductor layer and the lattice constant of each SiGe semiconductor layer; and each semiconductor layer of the semiconductor layer structure has a subcritical layer thickness.

16. A method as defined in claim 1 wherein the different semiconductor compositions are Si and SiGe, respectively, and said step of producing a doped layer is carried out in one of the SiGe layers by secondary doping substance implantation.

17. A method as defined in claim 1 wherein the layer thickness of said doped layer is less than the thickness of the SiGe layer in which it is formed.

* * * * *